(12) United States Patent
Lushington

(10) Patent No.: US 9,304,395 B2
(45) Date of Patent: Apr. 5, 2016

(54) CONDUCTIVE ELEMENT PRECURSOR AND CONDUCTIVE PATTERN FORMATION

(71) Applicant: Kenneth James Lushington, Rochester, NY (US)

(72) Inventor: Kenneth James Lushington, Rochester, NY (US)

(73) Assignee: EASTMAN KODAK COMPANY, Rochester, NY (US)

( * ) Notice: Subject to any disclaimer, the term of this patent is extended or adjusted under 35 U.S.C. 154(b) by 15 days.

(21) Appl. No.: 14/265,418

(22) Filed: Apr. 30, 2014

(65) Prior Publication Data

US 2015/0316848 A1 Nov. 5, 2015

(51) Int. Cl.
*G02F 1/1333* (2006.01)
*G03F 7/06* (2006.01)
*G03F 7/30* (2006.01)
*G03F 7/20* (2006.01)

(52) U.S. Cl.
CPC ................ *G03F 7/06* (2013.01); *G03F 7/2002* (2013.01); *G03F 7/30* (2013.01)

(58) Field of Classification Search
CPC ........... G03F 1/1333; G03F 7/06; G03F 7/30; G03F 7/2002
USPC ........................... 430/264, 311, 325; 174/257
See application file for complete search history.

(56) References Cited

U.S. PATENT DOCUMENTS

| | | | |
|---|---|---|---|
| 3,184,313 A | 5/1965 | Rees et al. | |
| 3,464,822 A | 9/1969 | Blake | |
| 3,630,744 A | 12/1971 | Thiers et al. | |
| 3,671,254 A | 6/1972 | Dostes | |
| 5,783,379 A | 7/1998 | Willems et al. | |
| 6,573,019 B1 | 6/2003 | Van den Zegel et al. | |
| 7,563,564 B2 | 7/2009 | Brooks et al. | |
| 7,943,291 B2 | 5/2011 | Tokunaga et al. | |
| 8,012,676 B2 | 9/2011 | Yoshiki et al. | |
| 8,658,907 B2 * | 2/2014 | Ichiki | ............................ 174/257 |
| 2011/0289771 A1 | 12/2011 | Kuriki | |
| 2011/0308846 A1 | 12/2011 | Ichiki | |

* cited by examiner

*Primary Examiner* — Geraldina Visconti
(74) *Attorney, Agent, or Firm* — J. Lanny Tucker

(57) ABSTRACT

A black-and-white silver halide conductive film element precursor has at least one first non-color hydrophilic photosensitive layer comprising a silver halide and a first hydrophilic overcoat disposed over the first non-color hydrophilic photosensitive layer. This first hydrophilic overcoat is the outermost layer and contains one or more immobilized radiation absorbers such as immobilized ultraviolet radiation absorbers, in a total amount of at least 5 mg/m$^2$. These precursors can be imagewise exposed and processed to provide conductive film elements with various conductive silver patterns (or grids) with narrow conductive silver lines on one or both sides. In many instances, the precursors have the same or different layers on both sides of a transparent substrate and the resulting conductive film element has the same or different conductive silver patterns on both sides.

20 Claims, No Drawings

CONDUCTIVE ELEMENT PRECURSOR AND CONDUCTIVE PATTERN FORMATION

RELATED APPLICATIONS

Reference is made to the following copending and commonly assigned patent applications, the disclosures of all of which are incorporated herein by reference:

U.S. Ser. No. 13/771,549 filed Feb. 20, 2013 by Sanger and Scaglione, now abandoned;

U.S. Ser. No. 13/919,203 filed Jun. 17, 2013 by Gogle, Lowe, O'Toole, and Youngblood; and U.S. Ser. No. 14/166,910 filed by myself on Jan. 29, 2014.

FIELD OF THE INVENTION

This invention relates to flexible and transparent black-and-white conductive element precursors having an overcoat containing immobilized radiation absorbers, and to methods for preparing flexible and transparent films having conductive metal patterns on one or both sides.

BACKGROUND OF THE INVENTION

Rapid advances are occurring in various electronic devices especially display devices that are used for various communicational, financial, and archival purposes. For such uses as touch screen panels, electrochromic devices, light emitting diodes, field effect transistors, and liquid crystal displays, conductive films are essential and considerable efforts are being made in the industry to improve the properties of those conductive films.

There is a particular need to provide touch screen displays and devices that contain improved conductive film elements. Currently, touch screen displays use Indium Tin Oxide (ITO) coatings to create arrays of capacitive areas used to distinguish multiple point contacts. ITO coatings have significant short comings. Indium is an expensive rare earth metal and is available in limited supply from very few sources in the world. ITO conductivity is relatively low and requires short line lengths to achieve adequate response rates. Touch screens for large displays are broken up into smaller segments to reduce the conductive line length to an acceptable resistance. These smaller segments require additional driving and sensing electronics. In addition ITO is a ceramic material, is not readily bent or flexed, and requires vacuum deposition with high processing temperatures to prepare the conductive layers.

Silver is an ideal conductor having conductivity 50 to 100 times greater than ITO. Unlike most metal oxides, silver oxide is still reasonably conductive and this reduces the problem of making reliable electrical connections. Silver is used in many commercial applications and is available from numerous sources. It is highly desirable to make conductive film elements using silver as the source of conductivity, but it requires considerable development to obtain the optimal properties.

U.S. Patent Application Publication 2011/0308846 (Ichiki) describes the preparation of conductive films formed by reducing a silver halide image in conductive networks with silver wire sizes less than 10 µm, which conductive films can be used to form touch panels in displays.

In addition, U.S. Pat. No. 3,464,822 (Blake) describes the use of a silver halide emulsion in a photographic element to form a conductive silver surface image by development and one or more treatment baths after development.

Improvements have been proposed for providing conductive patterns using photosensitive silver salt compositions such as silver halide emulsions as described for example in U.S. Pat. No. 8,012,676 (Yoshiki et al.). Such techniques involve the treatment using hot water baths containing reducing agents or halides.

U.S. Pat. No. 7,943,291 (Tokunaga et al.) describes photosensitive materials that can be used to prepare conductive silver-containing films. One or more layers for example an outermost protective layer can include various conductive fine particles such as metal oxide particles in a binder.

Thus, it is known to provide conductive silver patterns on transparent films and to put protective non-photosensitive overcoats over those conductive silver patterns. While known protective non-photosensitive overcoats provide physical protection for the conductive patterns, they also act as an insulating barrier between the conductive pattern and external electrical contacts used in a various display devices. Such insulating properties can render display device manufacture unreliable.

In the process of printing fine conductive lines (less than 10 µm) in conductive articles using silver or other conductive materials, back reflection off the article to the mask elements used to define the conductive pattern can cause "ghost" images off the mask elements. This causes the resulting conductive lines to broaden or widen in an undesirable extent and undesirably reduce transmittance in the resulting conductive articles. This problem becomes more severe as the mask element is moved relative to the precursor article that is to be imaged.

Thus, there is a need to create conductive patterns in conductive articles designed for display devices in which the noted problem is minimized or eliminated.

SUMMARY OF THE INVENTION

The present invention provides a black-and-white silver halide conductive film element precursor comprising a transparent substrate comprising a first supporting side and an opposing second supporting side, and having disposed on the first supporting side:

a first non-color hydrophilic photosensitive layer comprising a silver halide coverage of at least 3,500 mg Ag/m$^2$, and a first hydrophilic overcoat disposed over the first non-color hydrophilic photosensitive layer, which first hydrophilic overcoat is the outermost layer on the first supporting side of the transparent substrate, and the first hydrophilic overcoat comprises: (a) one or more immobilized radiation absorbers in a total amount of at least 5 mg/m$^2$, and optionally (b) one or more silver halides in a total amount of at least 5 mg Ag/m$^2$.

In some embodiments, the conductive film element precursor of this invention further comprises, on the opposing second supporting side of the transparent substrate, a second non-color hydrophilic photosensitive layer and a second hydrophilic overcoat disposed over the second non-color hydrophilic photosensitive layer, the second hydrophilic overcoat comprising: (a) one or more immobilized radiation absorbers in a total amount of at least 5 mg/m$^2$, and optionally (b) one or more silver halides in a total amount of at least 5 mg Ag/m$^2$.

Moreover, the present invention also provides a method for preparing a conductive film element comprising:

providing a black-and-white silver halide conductive element film precursor of any of the embodiments of this invention, imagewise exposing the black-and-white silver halide conductive film element precursor to provide a latent pattern in the first non-color hydrophilic photosensitive layer, converting the silver halide in the latent pattern to a silver metal pattern by contacting the latent pattern with a developing solution comprising a silver halide developing agent, removing unconverted silver halide from the first non-color hydrophilic photosensitive layer, leaving a silver metal pattern corresponding to the latent pattern, and optionally further treating the silver metal pattern to enhance its conductivity.

In some embodiments of the method of this invention, the conductive film element precursor further comprises on the opposing second supporting side of the transparent substrate, a second non-color hydrophilic photosensitive layer and a second hydrophilic overcoat disposed over the second non-color hydrophilic photosensitive layer, the second hydrophilic overcoat comprising one or more immobilized radiation absorbers (at least one of which can be an immobilized ultraviolet radiation absorber) in a total amount of at least 5 mg/m$^2$, and optionally silver halide in a coverage of at least 5 mg Ag/m$^2$.

The method of this invention can be used to provide a conductive film element comprising:

a transparent substrate that is optionally flexible, and the conductive film element comprising a first supporting side and an opposing second supporting side, and comprising on the first supporting side:

a first non-color hydrophilic layer comprising a conductive silver pattern, and the conductive film element having an integrated transmittance of at least 75% in the conductive silver pattern, and a first hydrophilic overcoat disposed over the first non-color hydrophilic layer, which first hydrophilic overcoat is the outermost layer on the first supporting side of the transparent substrate, and the first hydrophilic overcoat comprises one or more immobilized radiation absorbers in a total amount of at least 5 mg/m$^2$.

In some of these embodiments, the conductive film element further comprising on the opposing second supporting side:

a second non-color hydrophilic layer comprising a conductive silver pattern, and a second hydrophilic overcoat disposed over the first non-color hydrophilic layer, which second hydrophilic overcoat is the outermost layer on the second supporting side of the transparent substrate, and the second hydrophilic overcoat comprising one or more immobilized radiation absorbers (at least one of which can be an immobilized ultraviolet radiation absorber) in a total amount of at least 5 mg/m$^2$.

In such embodiments, the conductive silver pattern on the first supporting side of the transparent substrate and the conductive silver pattern on the opposing second supporting side of the transparent substrate are different in pattern arrangement.

The present invention provides conductive film elements that can be incorporated into display devices such as touch screens to provide various advantages. The conductive film elements are provided with a hydrophilic overcoat on one or both sides containing one or more immobilized radiation absorbers that absorb at the same wavelength as predetermined imaging radiation. In particularly useful embodiments, the immobilized radiation absorbers are immobilized ultraviolet radiation absorbers that can absorb radiation at a wavelength of at least 200 nm and up to and including 450 nm (that is, the absorption can be determined at a predetermined $\lambda_{max}$.

The present invention solves the noted "ghost image" problem caused by reflection from mask elements used during imaging of the non-color hydrophilic photosensitive layer(s). While it is known in traditional photographic materials to incorporate filter layers over the silver halide emulsion layer(s) to absorb undesired (non-imaging) radiation, it is not rational or desired in such instances to use filter dyes that absorb at the same wavelength used to provide the desired image. However, the one or more immobilized (non-mobile) radiation absorbers used in the present invention that absorb the same predetermined spectral radiation, and particular the same spectral radiation as the photosensitive silver halide, absorb the radiation that is reflected back to the mask elements.

The use of the immobilized radiation absorbers in the hydrophilic overcoat provides more uniform fine silver lines in the resulting conductive film elements with minimal line broadening during imaging. Thus, the conductive patterns on one or both sides of the conductive film elements have narrower conductive silver lines than when the immobilized radiation absorbers are omitted from the hydrophilic overcoats.

DETAILED DESCRIPTION OF THE INVENTION

The following discussion is directed to various embodiments of the present invention and while some embodiments can be preferred for specific uses, the disclosed embodiments should not be interpreted or otherwise considered to be limiting the scope of the present invention, as claimed below. In addition, one skilled in the art will understand that the following disclosure has broader application than is explicitly described and the discussion of any embodiment.

DEFINITIONS

As used herein to define various components of the various layers or formulations used to form layers and processing solutions, unless otherwise indicated, the singular forms "a", "an", and "the" are intended to include one or more of the components (that is, including plurality referents).

Each term that is not explicitly defined in the present application is to be understood to have a meaning that is commonly accepted by those skilled in the art. If the construction of a term would render it meaningless or essentially meaningless in its context, the definition should be taken from a standard dictionary.

The use of numerical values in the various ranges specified herein, unless otherwise expressly indicated otherwise, are considered to be approximations as though the minimum and maximum values within the stated ranges were both preceded by the word "about". In this manner, slight variations above and below the stated ranges can be used to achieve substantially the same results as the values within the ranges. In addition, the disclosure of these ranges is intended as a continuous range including every value between the minimum and maximum values.

Unless otherwise indicated, the term "weight %" refers to the amount of a component or material based on the total solids of a composition, formulation, solution, or the % of the dry weight of a layer. Unless otherwise indicated, the percentages can be the same for either a dry layer or pattern, or for the total solids of the formulation or composition used to make that layer or pattern.

A "black-and-white silver halide conductive film element precursor" (or "precursor") is meant to refer to an article or element of this invention that can be used to provide the conductive film element (or conductive article) of the present invention. Such precursors therefore comprise a photosensitive precursor to the silver metal nuclei (particles), such as a silver halide as described below that is suitably converted (for example by reduction) to silver metal. Much of the discussion about the precursors is equally applicable to the conductive film elements as most of the components and structure are not changed when silver cations in a silver halide are converted to silver metal nuclei. Thus, unless otherwise indicated, the discussion of transparent substrates, hydrophilic binders and colloids, immobilized radiation absorbers, and other addenda in non-color hydrophilic photosensitive layers and hydrophilic overcoats for the precursors are also intended to describe the components and structure of the resulting conductive film elements.

Unless otherwise indicated, the terms "conductive film element" and "conductive article" are intended to mean the same thing.

The term "first" refers to the layers on one supporting side of the transparent substrate and the term "second" refers to the layers on the opposing (opposite) second supporting side of the transparent substrate. Each supporting side of the transparent substrate can be equally useful and the term "first" does not necessarily mean that such side is the primary or better supporting side of the support.

The term "duplex" is used herein in reference to black-and-white silver halide conductive film element precursors and conductive film elements having the described layers on both supporting sides of the transparent substrate. Unless otherwise indicated herein, the relationships and compositions of the various layers can be the same or different on both supporting sides of the transparent substrate.

ESD refers to "equivalent spherical diameter" and is a term used in the photographic art to define the size of particles such as silver halide grains. Particle size of silver halide grains as expressed in grain ESD can be readily determined using disc centrifuge instrumentation.

The "immobilized radiation absorbers" used in the present invention refer to compounds that absorb at a predetermined spectral absorption wavelength ($\lambda_{max}$) or range of wavelengths within the general range of at least 200 nm and up to and including 700 nm. Particularly useful immobilized radiation absorbers include immobilized ultraviolet radiation absorbers that can absorb in the general range of at least 300 nm and up to and including 450 nm (or more likely at least 300 nm and up to and including 400 nm).

The immobilized radiation absorbers do not readily migrate out of the hydrophilic overcoat in which they are incorporated. By this we mean that the immobilized ultraviolet radiation absorber has a c(logP) value of at least 5 and more likely at least 6 in order to provide sufficient diffusion resistance in the hydrophilic overcoat. The parameter "c(logP)" refers to the logarithmic octanol-water partition coefficient that is a physical property used to describe a compound's lipophilic or hydrophobic properties. It is the ratio of the compound's concentration in the octanol phase to its concentration in the aqueous phase of a two-phase system at equilibrium. Since measured values range from less than $10^{-4}$ to greater than $10^{+8}$ (at least 12 orders of magnitude), the logarithm (log P) is commonly used to characterize this value. Known software programs can be used to determine this value for a given ultraviolet radiation absorber. One program methodology used to determine c(logP) values is described by Meylan et al. in *Pharm. Sci.* 84:83-92 (1995). The c(logP) values can also be calculated using a computer program provided by SRC. Inc. (formerly Syracuse Research Corporation), which computer program and methodology are identified below as the "SRC method".

Integrated transmittance can be determined using a known spectrophotometer and procedures designed for its use.

Uses

The black-and-white silver halide conductive film element precursors of this invention can be used in many ways to form conductive film elements comprising a conductive silver metal pattern on a suitable transparent substrate. These conductive film elements can be used as devices themselves or they can be used as components in devices having a variety of applications including but not limited to, electronic, optical, sensory, and diagnostic uses. In particular, it is desired to use the precursors of the present invention to provide highly conductive silver metal patterns comprising lines having a line resolution (line width) of less than 50 μm, or less than 15 μm or even less than 10 μm and as low as 1 μm.

Such electronic and optical devices and components include but are not limited to, radio frequency tags (RFID), sensors, touch screen displays, and memory and back panel displays.

Touch screen technology can comprise different touch sensor configurations including capacitive and resistive touch sensors. Resistive touch sensors comprise several layers that face each other with a gap between adjacent layers that can be preserved by spacers formed during manufacturing. A resistive touch screen panel can comprise several layers including two thin, metallic, electrically conductive layers separated by a gap that can be created by spacers. When an object such as a stylus, palm, or fingertip presses down on a point on the panel's outer surface, the two metallic layers come into contact and a connection is formed that causes a change in the electrical current. This touch event is sent to a controller for further processing.

Capacitive touch sensors can be used in electronic devices with touch-sensitive features. These electronic devices can include but are not limited to, televisions, monitors, and projectors that can be adapted to display images including text, graphics, video images, movies, still images, and presentations. The image devices that can be used for these display devices that can include cathode ray tubes (CRS's), projectors, flat panel liquid crystal displays (LCD's), LED systems, OLED systems, plasma systems, electroluminescent displays (ECD's), and field emission displays (FED's). For example, the present invention can be used to prepare capacitive touch sensors that can be incorporated into electronic devices with touch-sensitive features to provide computing devices, computer displays, portable media players including e-readers, mobile telephones and other communicating devices.

Systems and methods of fabricating flexible and optically compliant touch sensors in a high-volume roll-to-roll manufacturing process where micro electrically conductive features can be created in a single pass are possible using the present invention. The precursors can be used in such systems and methods to form multiple high resolution conductive images from predetermined designs of patterns from exposure through multiple masking elements. Multiple patterns can be printed on one or both sides of a transparent substrate as described in more details below. For example, one predetermined pattern can be printed on one supporting side of the transparent substrate and a different predetermined pattern can be printed on the opposing second supporting side of the transparent substrate.

Black-and-White Silver Halide Conductive Film Element Precursors

The black-and-white silver halide conductive film element precursors of this invention are photosensitive but do not contain chemistry to provide color photographic images. Thus, these precursors are considered to be black-and-white photosensitive materials and significantly non-color image-forming.

In most embodiments, the precursors and the resulting conductive film elements, including the transparent substrate and all accompanying layers on one or both supporting sides, are considered transparent meaning that the integrated transmittance in the entire visible region of the electromagnetic spectrum (for example from 400 nm to 750 nm) through the entire element is 75% or more, or more likely at least 90% or even 95% or more, as determined using a spectrophotometer and known procedures.

Precursors having the same or different essential layers on both supporting sides of the transparent substrate can be known as "duplex" or "two-sided" precursors.

Each precursor can be formed by providing a first non-color (that is, black-and-white) hydrophilic photosensitive layer on at least one supporting or planar side (as opposed to non-supporting edges) of a suitable transparent substrate in a suitable manner. This first non-color hydrophilic photosensitive layer comprises a silver halide, or a mixture of silver halides, at a total silver coverage of at least 3500 mg Ag/m$^2$ and in some embodiments, less than 5000 mg Ag/m$^2$, for example up to and including 4900 mg Ag/m$^2$, but higher amounts are possible. Thus, this non-color hydrophilic photosensitive layer has sufficient silver halide and sensitization to be photosensitive to selected (predetermined) imaging irradiation (described below).

The one or more silver halides are dispersed within one or more suitable hydrophilic binders or colloids as described below also.

Such precursors are therefore treated in such a manner as to convert the silver cations (such as by reduction) into silver metal nuclei, and this precursor can then become a conductive film element of the present invention after appropriate treatment or processing steps. Thus, in many embodiments, the precursors of this invention consist essentially of two essential layers on one or both supporting sides of the transparent substrate; that is a non-color hydrophilic photosensitive layer disposed on the transparent substrate and a hydrophilic overcoat disposed directly on the non-color hydrophilic photosensitive layer. These essential layers can be disposed on only one supporting side of the transparent substrate, or they can be disposed on both first supporting and opposing second supporting sides of the transparent substrate, in the same order. Optional layers can also be present on either or both supporting sides and are described below but they are not essential to achieve the desired advantages of the present invention.

Transparent Substrates:

The essential layers and any optional layers are disposed in a suitable manner on one or both supporting sides (planar surfaces) of a transparent substrate. The choice of transparent substrate generally depends upon the intended utility of the resulting conductive film element, and can be any transparent substrate on which a conductive silver film, conductive silver grid, or conductive wiring pattern can be formed. The transparent substrate can be rigid or flexible and generally transparent as described above. For example, the transparent substrate can be a transparent and flexible, having an integrated transmittance of at least 75% and generally at least 95%. Suitable transparent substrates include but are not limited to, glass, glass-reinforced epoxy laminates, cellulose triacetate, acrylic esters, polycarbonates, adhesive-coated polymer transparent substrates, polymer substrates, and composite materials. For example, suitable polymers for use as polymer substrates include but are not limited to, polyesters such as polyethylene terephthalate (PET) and polyethylene naphthalate (PEN), poly-1,4-cyclohexanedimethylene terephthalate, poly(butylene terephthalate), and copolymers thereof, polypropylenes, polyvinyl acetates, polyurethanes, polyamides, polyimides, polysulfones, cellulose derivatives such as a cellulose ester, cellulose triacetate, cellulose diacetate, cellulose acetate propionate, cellulose acetate butyrate, polycarbonates, polystyrene, polyolefins such as polyethylene or polypropylene, polysulfones, polyacrylates, polyether imides, and mixtures thereof.

Flexible and transparent polymeric substrates can also comprise two or more layers of the same or different or polymeric composition so that the composite transparent substrate (or laminate) has the same or different layer refractive properties. The transparent substrate can be treated on either or both supporting sides to improve adhesion of a silver salt emulsion or dispersion to one or both supporting sides of the transparent substrate. For example, the transparent substrate can be coated with a polymer adhesive layer or one or both supporting sides can be chemically treated or subjected to a corona treatment.

The substrates are transparent to facilitate transmittance of the entire material to provide integrated transmittance of at least 95% in the visible region of the electromagnetic spectrum (for example at least 400 nm and up to and including 750 nm). It is possible for the transparent substrate to be slightly colored as long as the desired transmittance is preserved.

Biaxially oriented sheets, while described as having at least one layer, can also be provided with additional layers that can serve to change the optical or other properties of the biaxially oriented sheet. Such layers might contain tints, antistatic or conductive materials, or slip agents to produce sheets of unique properties. The biaxially oriented extrusion can be carried out with as many as 10 layers if desired to achieve some particular desired property. The biaxially oriented sheet can be made with layers of the same polymeric material, or it can be made with layers of different polymeric composition.

Particularly useful transparent substrates for the manufacture of flexible electronic devices or touch screen components are to aid rapid roll-to-roll application. Estar® poly(ethylene terephthalate) films and cellulose triacetate films are particularly useful materials for making flexible transparent substrates for this purpose.

The transparent substrate can be the same as a support or film that is already incorporated into a flexible display device, by which it is meant that essential layers described herein are applied to a transparent substrate material within a display device and imaged in situ according to a desired pattern, and then processed in situ.

Where a discrete transparent substrate is utilized (that is, the transparent substrate is not already incorporated in a flexible display device), the essential layers (from formulations) and optional layers are applied to one or both supporting sides thereof. If different patterns (or grids) are intended for each supporting side, the transparent substrate or optional intervening filter (or antihalation) layers comprising filter dyes can be provided to prevent light exposure from one side reaching the other. Alternatively, the non-color photosensitive silver halide emulsions can be sensitized differently on the opposing supporting sides of the transparent substrate.

The transparent substrate used in the conductive film element precursor can have a thickness of at least 20 μm and up to and including 300 μm or typically at least 75 μm and up to and including 200 μm. Antioxidants, brightening agents, antistatic or conductive agents, plasticizers, and other known additives can be incorporated into the transparent substrate, if desired, in amounts that would be readily apparent to one skilled in the art.

Non-Color Hydrophilic Photosensitive Layers:

The essential silver halide(s) in the non-color hydrophilic photosensitive layers comprise silver cations of one or more silver halides that can be converted into silver metal nuclei according to a desired pattern upon photoexposure of each non-color hydrophilic photosensitive layer in an imagewise fashion. The silver latent image obtained by exposure to suitable radiation can then be developed into a silver metal image using known silver development procedures and chemistry (described below). The silver halide (or combination of silver halides) is photosensitive, meaning that radiation from UV to visible light (for example, of at least 200 nm and up to and including 750 nm radiation) is generally used to convert silver cations to silver metal nuclei in a latent image. In some embodiments, the silver halide is present with a thermally-sensitive silver salt (such as silver behenate) and the non-color photosensitive hydrophilic layer can be both photosensitive and thermally sensitive (sensitive to imaging thermal energy such as infrared radiation).

The useful photosensitive silver halides can be, for example, silver chloride, silver bromide, silver chlorobromoiodide, silver bromochloroiodide, silver chlorobromide, silver bromochloride, or silver bromoiodide that are prepared as individual compositions (or emulsions). The various halides are listed in the silver halide name in descending order of halide amount. In addition, individual silver halide emulsions can be prepared and mixed to form a mixture of silver halide emulsions that are used on the same or different supporting sides of the transparent substrate. In general, the useful silver halides comprise up to and including 100 mol % of chloride or up to and including 100 mol % of bromide, and up to and including 5 mol % iodide, all based on total silver. These silver halides are generally known as "high chloride" or "high bromide" silver halides and are used to form "high chloride", or "high bromide" emulsions, respectively. Particularly useful silver halides comprise at least 50 mol % and up to and including 100 mol % bromide and the remainder is either or both of chloride or iodide, based on the total silver.

The silver halide grains used in each non-color hydrophilic photosensitive layer generally have an ESD of at least 30 nm and up to and including 300 nm, or more likely at least 50 nm and up to and including 200 nm.

The coverage of total silver in the silver halide(s) in each non-color hydrophilic photosensitive layer can be at least 3500 mg Ag/m$^2$ and typically at least 3500 mg Ag/m$^2$ and the amount can be less than 5000 mg Ag/m$^2$, for example up to and including 4900 mg Ag/m$^2$. Higher amounts for example up to and including 8,000 mg Ag/m$^2$ on each supporting side of the transparent substrate can be used if desired. These amounts of silver halide are then converted by the processes described below to corresponding amounts of silver metal nuclei in each conductive layer on each or both supporting sides of the transparent substrate for the resulting conductive film elements.

The dry thickness of each non-color hydrophilic photosensitive layer is generally at least 0.1 μm and up to and including 10 μm, and typically it is at least 0.1 μm and up to and including 5 μm.

The final dry non-color hydrophilic photosensitive layer can be made up of one or more individually coated non-color hydrophilic photosensitive sub-layers that can be applied using the same or different silver halide emulsion formulations. Each sub-layer can be composed of the same or different silver halide(s), hydrophilic binders or colloids, and addenda. The sub-layers can have the same or different amount of silver content.

The photosensitive silver halide(s) used in the first non-color hydrophilic photosensitive layer on one supporting side of the transparent substrate can be the same or different as the photosensitive silver halide(s) used in the opposing second supporting side non-color hydrophilic photosensitive layer.

The photosensitive silver halide grains (and any addenda associated therewith as described below) are dispersed (generally uniformly) in one or more suitable hydrophilic binders or colloids to form a hydrophilic silver halide emulsion. Examples of such hydrophilic binders or colloids include but are not limited to, hydrophilic colloids such as gelatin and gelatin derivatives, polyvinyl alcohol (PVA), poly(vinyl pyrrolidone) (PVP), casein, and mixtures thereof. Suitable hydrophilic colloids and vinyl polymers and copolymers are also described in Section IX of *Research Disclosure Item 36544*, September 1994 that is published by Kenneth Mason Publications, Emsworth, Hants, PO10 7DQ, UK. A particularly useful hydrophilic colloid is gelatin or a gelatin derivative of which several are known in the photographic art.

The amount of hydrophilic binder or colloid in each non-color hydrophilic photosensitive layer can be adapted to the particular dry thickness that is desired as well as the amount of silver halide that is incorporated. It can also be adapted to meet desired dispersibility and layer adhesion to the transparent substrate. In general, the one or more hydrophilic binders or colloids are present in an amount of at least 10 weight % and up to and including 95 weight % based on the total solids in the emulsion formulation or dry layer. The dry ratio of hydrophilic binder(s) to silver in each non-color hydrophilic photosensitive layer can vary widely depending upon desired conductivity and integrated transmittance, and can be for example from 1:10 to 10:1.

One useful non-color hydrophilic photosensitive layer composition has a relatively high silver ion/low hydrophilic binder (for example, gelatin) weight ratio. For example, a particularly useful weight ratio of silver ions (and eventually silver metal) to hydrophilic binder or colloid such as gelatin (or its derivative) is at least 0.1:1, or even at least 1.5:1 and up to and including 10:1. A particularly useful weight ratio of silver ions to the hydrophilic binder or colloid can be at least 2:1 and up to and including 5:1. Other weight ratios can be readily adapted for a particular use and dry layer thickness.

In some embodiments, the hydrophilic binder or colloid is used in combination with one or more hardeners designed to harden the particular hydrophilic binder such as gelatin. Particularly useful hardeners for gelatin and gelatin derivatives include but are not limited to, non-polymeric vinyl-sulfones such as bis(vinyl-sulfonyl) methane (BVSM), bis(vinyl-sulfonyl methyl) ether (BVSME), and 1,2-bis(vinyl-sulfonyl acetamide)ethane (BVSAE). Mixtures of hardeners can be used if desired. The hardeners can be incorporated into each non-color hydrophilic photosensitive layer in any suitable amount that would be readily apparent to one skilled in the art.

In general, each non-color hydrophilic photosensitive layer can have a swell ratio of at least 150% as determined by optical microscopy of element cross-sections and the amount of swell can be controlled generally by the amount of hardener in the layers or in processing solutions.

In many embodiments, the silver halide in the silver halide emulsion(s) can be sensitized to any suitable wavelength of exposing radiation. Organic visible sensitizing dyes can be used, but it can be advantageous to sensitize the silver salt to the UV portion of the electromagnetic spectrum without using visible light sensitizing dyes to avoid unwanted dye stains to improve integrated transmittance.

Useful addenda that can be included with the silver halides include chemical and spectral sensitizers, filter dyes, organic solvents, thickeners, dopants, emulsifiers, surfactants, stabilizers, hardeners, and antifoggants such as those materials described in *Research Disclosure Item* 36544, September 1994 and the many publications identified therein. Such materials are well known in the art and it would not be difficult for a skilled artisan to formulate or use for purposes described herein. Some useful silver salt emulsions are described, for example in U.S. Pat. No. 7,351,523 (Grzeskowiak), U.S. Pat. No. 5,589,318, and U.S. Pat. No. 5,512,415 (both to Dale et al.). Other useful silver halide emulsions are described in copending and commonly assigned U.S. Ser. No. 14/166,910 (noted above).

Useful silver halide emulsions containing silver halide grains that can be reduced to silver metal particles can be prepared by any suitable method of grain growth, for example, by using a balanced double run of silver nitrate and salt solutions using a feedback system designed to maintain the silver ion concentration in the growth reactor. Known dopants can be introduced uniformly from start to finish of precipitation or can be structured into regions or bands within the silver halide grains. Useful dopants include but are not limited to, osmium dopants, ruthenium dopants, iron dopants, rhodium dopants, iridium dopants, and cyanoruthenate dopants. A combination of osmium and iridium dopants such as a combination of osmium nitrosyl pentachloride and iridium dopant is useful. Such complexes can be alternatively utilized as grain surface modifiers in the manner described in U.S. Pat. No. 5,385,817 (Bell). Chemical sensitization can be carried out by any of the known silver halide chemical sensitization methods, for example using thiosulfate or another labile sulfur compound, or in combination with gold complexes.

Useful silver halide grains can be cubic, rounded-cubic, octahedral, rounded octahedral, polymorphic, tabular, or thin tabular emulsion grains. Such silver halide grains can be regular untwinned, regular twinned, or irregular twinned with cubic, rounded-cubic, or octahedral faces. In one embodiment, the silver halide grains can be cubic having an ESD of less than 0.5 µm and at least 0.05 µm.

Specific references relating to the preparation of emulsions of differing halide ratios and morphologies are U.S. Pat. No. 3,622,318 (Evans); U.S. Pat. No. 4,269,927 (Atwell); U.S. Pat. No. 4,414,306 (Wey et al.); U.S. Pat. No. 4,400,463 (Maskasky); U.S. Pat. No. 4,713,323 (Maskasky); U.S. Pat. No. 4,804,621 (Tufano et al.); U.S. Pat. No. 4,783,398 (Takada et al.); U.S. Pat. No. 4,952,491 (Nishikawa et al.); U.S. Pat. No. 4,983,508 (Ishiguro et al.); U.S. Pat. No. 4,820,624 (Hasebe et al.); U.S. Pat. No. 5,264,337 (Maskasky); U.S. Pat. No. 5,275,930 (Maskasky); U.S. Pat. No. 5,320,938 (House et al.); U.S. Pat. No. 5,550,013 (Chen et al.); U.S. Pat. No. 5,726,005 (Chen et al.); and U.S. Pat. No. 5,736,310 (Chen et al.).

Antifoggants and stabilizers can be added to give the silver halide emulsion the desired sensitivity, if appropriate. Antifoggants that can be used include, for example, azaindenes such as tetraazaindenes, tetrazoles, benzotriazoles, imidazoles and benzimidazoles. Specific antifoggants that can be used include but are not limited to, 4-carboxymethyl-4-thiazoline-2-thione, 4-hydroxy-6-methyl-1,3,3a,7-tetraazaindene, 1-(3-acetamidophenyl)-5-mercaptotetrazole, 6-nitrobenzimidazole, 2-methylbenzimidazole, and benzotriazole, individually or in combination.

The essential silver halide grains and hydrophilic binders or colloids and optional addenda can be formulated and coated as a silver halide emulsion using suitable emulsion solvents including water and water-miscible organic solvents. For example, useful solvents for making the silver halide emulsion or coating formulation can be water, an alcohol such as methanol, a ketone such as acetone, an amide such as formamide, a sulfoxide such as dimethyl sulfoxide, an ester such as ethyl acetate, an ether, a liquid poly(vinyl alcohol), or combinations of these solvents. The amount of one or more solvents used to prepare the silver halide emulsions can be at least 30 weight % and up to and including 50 weight % of the total formulation weight. Such coating formulations can be prepared using any of the photographic emulsion making procedures that are known in the photographic art.

Hydrophilic Overcoats:

Disposed over each non-color hydrophilic photosensitive layer, on either or both supporting sides of the transparent substrate, is a hydrophilic overcoat. This hydrophilic overcoat can be the outermost layer in the conductive film element precursor (that is, there are no layers purposely placed over it on either or both supporting sides of the transparent substrate). Thus, generally if both supporting sides of the transparent substrate are used to provide a conductive silver pattern, then a hydrophilic overcoat can be present as the outermost layer on both supporting sides of the transparent substrate. Thus, a first hydrophilic overcoat can be disposed over the first non-color hydrophilic photosensitive layer on the first supporting side of the transparent substrate, and a second hydrophilic overcoat can be disposed over a second non-color second hydrophilic photosensitive layer on the opposing second supporting side of the transparent substrate. In most embodiments, each hydrophilic overcoat can be directly disposed on each non-color hydrophilic photosensitive layer, meaning that there are no intervening layers on the supporting sides of the transparent substrate. The chemical compositions and dry thickness of these hydrophilic overcoats can be the same or different, but in most embodiments they have essentially the same chemical composition and dry thickness on both supporting sides.

At least the first hydrophilic overcoat, and typically both hydrophilic overcoats on opposing sides, comprises one or more immobilized radiation absorbers (such as immobilized ultraviolet radiation absorbers) in a total amount of at least 5 mg/m$^2$, or more typically in an amount of at least 5 mg/m$^2$ and up to and including 100 mg/m$^2$, or even at least 10 mg/m$^2$ and up to and including 50 mg/m$^2$. When mixtures of immobilized radiation absorbers (such as immobilized ultraviolet radiation absorbers) are used, these amounts represent the total amount of all immobilized radiation absorbers in the particular hydrophilic overcoat.

The one or more immobilized ultraviolet radiation absorbers useful in this invention can be selected from one or more of the classes of compounds including but not limited to, benzotriazoles (including substituted hydroxyphenylbenzotriazoles), benzophenones, cinnamic acid compounds, triazines (including hydroxyphenyltriazines), stilbenes, benzoxazoles, dibenzoylmethanes, cyanoesters, cyanosulfones, cyanoacrylates, formamindines, and benzoazinones that are known to absorb ultraviolet radiation and also have the necessary c(logP) value of at least 5 as described above.

The substituted hydroxyphenylbenzotriazoles are particularly useful and can be obtained from a variety of commercial sources. For example, the UV radiation absorbers sold under the TINUVIN® mark are particularly useful. Mixtures of these compounds can be used if desired to provide the desired radiation absorption. For example, the commercial product marketed as TINUVIN® 8515 or Chiguard® 8515DF is a mixture of immobilized ultraviolet absorbing compounds [CAS 25973-55-1 having a c(logP) of 7.25] and [CAS 3896-11-5 having a c(logP) of 5.55] can be used.

Many useful immobilized radiation absorbers can be obtained from various commercial sources or they can be prepared using known synthetic methods and starting materials.

While some of the hydrophilic overcoats contain no addenda other than the immobilized ultraviolet radiation absorbers, and perhaps matte particles and surfactants, some embodiments of this invention comprise one or more silver halides in the hydrophilic overcoats in the same or different amount so as to provide silver metal (nuclei), after exposure and processing, in an amount of at least 5 mg Ag/m$^2$ and up to and including 150 mg Ag/m$^2$, or at least 5 mg Ag/m$^2$ and up to and including 75 mg Ag/m$^2$.

This silver halide and the immobilized ultraviolet radiation absorbers are dispersed (generally uniformly) within one or more hydrophilic binders or colloids in each hydrophilic overcoat, which hydrophilic binders or colloids include those described above for the non-color hydrophilic photosensitive layers. In many embodiments, the same hydrophilic binders or colloids can be used in all of the layers of the black-and-white silver halide conductive film element precursor. However, different hydrophilic binders or colloids can be used in the various layers and on either or both supporting sides of the transparent substrate. The amount of one or more hydrophilic binders or colloids in each hydrophilic overcoat can be the same or different and generally at least 50 weight % and up to and including 99 weight %, based on total hydrophilic overcoat dry weight.

Each hydrophilic overcoat can also comprise one or more hardeners for a hydrophilic binder or colloid (such as gelatin or a gelatin derivative). Useful hardeners are described above.

When present, the same or different silver halide(s) can be used in each hydrophilic overcoat on opposing supporting sides, and they can be the same as the silver halide(s) in each non-color hydrophilic photosensitive layer over which the hydrophilic overcoat is disposed.

Moreover, such one or more silver halides in each hydrophilic overcoat can have a grain ESD of at least 100 nm and up to and including 1000 nm, or at least 150 nm and up to and including 600 nm.

In some embodiments, such one or more silver halides in each hydrophilic overcoat has a grain ESD that is larger than the grain ESD of the silver halide in the non-color hydrophilic photosensitive layer over which it is disposed.

The dry thickness of the each hydrophilic overcoat can be at least 100 nm and up to and including 800 nm, or more particularly at least 300 nm and up to and including 500 nm. In many embodiments, the grain ESD to dry thickness ratio in the hydrophilic overcoat can be from 0.25:1 to and including 1.75:1 or more likely from 0.5:1 to and including 1.25:1.

It is also useful in conductive film element precursors of the present invention that the silver halide(s) in the each hydrophilic overcoat and the silver halide(s) in each non-color hydrophilic photosensitive layer over which it is disposed are matched in photographic speed. This is best achieved when the exposure sensitivity of the silver halide emulsion(s) in the hydrophilic overcoat is at least 10% and up to and including 200% of the optimum sensitivity of silver halide emulsion in the underlying non-color hydrophilic photosensitive layer used to provide the conductive silver pattern, as expressed in $\mu J/m^2$.

Additional Layers:

In addition to the two essential layers and components described above on one or both supporting sides of the transparent substrate, the black-and-white silver halide conductive film element precursor and conductive film elements of this invention can also include other layers that are not essential but can provide some additional properties or benefits, such as light absorbing filter interlayers, adhesion layers, and other layers as are known in the photographic art. The light absorbing filter layers can also be known as antihalation layers that can be located between the essential layers and the transparent substrate. For example, each transparent substrate supporting side can have a light absorbing filter layer disposed directly on it, and directly disposed underneath the non-color hydrophilic photosensitive layer.

Light absorbing filter interlayers can include one or more filter dyes that absorb in the UV, red, green, or blue regions of the electromagnetic spectrum or any combination thereof, and such light absorbing filter layers can be on located between the transparent substrate and the non-color hydrophilic photosensitive layer on each or both supporting sides of the transparent substrate.

The duplex embodiments of the black-and-white silver halide conductive film element precursors further comprise on the opposing second supporting side of the transparent substrate, a second non-color hydrophilic photosensitive layer and a second hydrophilic overcoat disposed over the second non-color hydrophilic photosensitive layer. An UV absorbing layer can be disposed between the or opposing second supporting side of the transparent substrate and the second non-color hydrophilic photosensitive layer, which UV absorbing layer can be the same as or different from the UV absorbing layer on the first supporting side of the transparent substrate.

In many duplex embodiments, the second non-color hydrophilic photosensitive layer and the second hydrophilic overcoat have the same composition as the first non-color hydrophilic photosensitive layer and the first hydrophilic overcoat, respectively.

Thus, in some embodiments, the conductive film element precursor can further comprise, on the opposing second supporting side of the transparent substrate, a second non-color hydrophilic photosensitive layer and a second hydrophilic overcoat disposed over the second non-color hydrophilic photosensitive layer, which hydrophilic overcoat comprises one or more immobilized ultraviolet radiation absorbers.

In other embodiments, the exposure sensitivity of the silver halide emulsion in the first hydrophilic overcoat is at least 10% and up to and including 200% of the optimum sensitivity of the silver halide emulsion in the first non-color hydrophilic photosensitive layer, as expressed as $\mu J/m^2$, and the exposure sensitivity of the silver halide emulsion in the second hydrophilic overcoat is at least 10% and up to and including 200% of the optimum sensitivity of the silver halide emulsion in the second non-color hydrophilic photosensitive layer, as expressed as $\mu J/m^2$. The optimum sensitivities of the respective sides of the transparent substrate can be the same or different.

Preparing Black-and-White Silver Halide Conductive Film Element Precursors

The various layers are formulated using appropriate components and coating solvents and are applied to one or both supporting sides of a suitable transparent substrate (as described above) using known coating procedures including those commonly used in the photographic industry (for example, bead coating, blade coating, curtain coating, hopper coating). Each layer formulation can be applied to each supporting side of the transparent substrate in single-pass procedures or simultaneous multi-layer coating procedures.

Providing Conductive Film Elements

The black-and-white silver halide conductive film element precursors of this invention are provided for use in the method of this invention and then imagewise exposed to provide a latent silver metal image in each non-color hydrophilic photosensitive layer on the transparent substrate. Imagewise exposure also reduces any silver halide(s) in each hydrophilic overcoat(s) to silver metal nuclei.

More commonly, photosensitive silver halides in each non-color hydrophilic photosensitive layer can be imagewise exposed to appropriate actinic radiation (UV to visible radiation) from a suitable source that are well known in the art, and then developed (silver ions reduced to silver nuclei) using known aqueous developing solutions (developers) that are commonly used in black-and-white photography. Such developers develop the silver halides in the latent images in both the exposed non-color hydrophilic photosensitive layers and the hydrophilic overcoats.

Prebath solutions can also be used to treat the exposed silver salts prior to development. Such solutions can include one or more development inhibitors as described above for the developing solutions, and in the same or different amounts. Effective inhibitors include but are not limited to, benzotriazoles, heterocyclic thiones, and mercaptotetrazoles. The prebath temperature can be in a range as described for development. Prebath time depends upon concentration and the particular inhibitor, but it can range from at least 10 seconds and up to and including 4 minutes.

Numerous developing solutions are known to form silver metal, for example in the form of a grid or pattern corresponding to the imagewise exposure. One commercial silver halide developer that is useful is Accumax® silver halide developer particularly when silver chlorobromide grains are used.

Developing solutions are generally aqueous solutions including one or more silver halide developing agents, of the same or different type, including but not limited to those described in *Research Disclosure Item* 17643 (December, 1978) Item 18716 (November, 1979), and Item 308119 (December, 1989) such as polyhydroxybenzenes (such as dihydroxybenzene, or in its form as hydroquinone, cathecol, pyrogallol, methylhydroquinone, and chlorohydroquinone), aminophenols such as p-methylaminophenol, p-aminophenol, and p-hydroxyphenylglycine, p-phenylenediamines, ascorbic acid and its derivatives, reductones, erythrobic acid and its derivatives, 3-pyrazolidones such as 1-phenyl-4,4-dimethyl-3-pyrazolidone, 1-phenyl-3-pyrazolidone, and 1-phenyl-4-methyl-4-hydroxymethyl-3-pyrazolidone, pyrazolone, pyrimidine, dithionite, and hydroxylamines. These developing agents can be used individually or in combinations thereof. One or more developing agents can be present in known amounts.

The developing solutions can also include auxiliary silver developing agents that exhibit super-additive properties with a developing agent. Such auxiliary developing agents can include but are not limited to, Elon and substituted or unsubstituted phenidones, in known amounts.

Useful developing solutions can also include one or more silver complexing agents (or silver ligands) including but not limited to, sulfite, thiocyanate, thiosulfate, thiourea, thiosemicarbazide, tertiary phosphines, thioethers, amines, thiols, aminocarboxylates, triazolium thiolates, pyridines (including bipyridine), imidazoles, and aminophosphonates, in known amounts.

The developing solutions can also comprise one or more substituted or unsubstituted mercaptotetrazoles in suitable amounts for various purposes. Useful mercaptotetrazoles include but are not limited to, alkyl-, aryl-, and heterocyclyl-substituted mercaptotetrazoles. Examples of such compounds include but are not limited to, 1-phenyl-5-mercaptotetrazole (PMT), 1-ethyl-5-mercaptotetrazole, 1-t-butyl-5-mercaptotetrazole, and 1-pyridinyl-5-mercaptotetrazoles.

Moreover, the developing solution can also include one or more development inhibitors in suitable amounts. Useful development inhibitors include but are not limited to, substituted and unsubstituted benzotriazole compounds such as 5-methylbenzotriazole, imidazoles, benzimidazole thiones, benzathiazole thiones, benzoxazole thiones, and thiazoline thiones.

Other addenda that can be present in the developing solutions in known amounts include but are not limited to, metal chelating agents, preservatives (such as sulfites), antioxidants, small amounts of water-miscible organic solvents (such as benzyl alcohol and diethylene glycol), nucleators, as well as acids, bases (such as alkali hydroxides), and buffers (such as carbonate, borax, phosphates, and other basic salts) to establish a pH of at least 8 and generally of a pH of at least 9.5, or at least 11 and up to and including 14.

Multiple development steps can be used if desired. For example, a first developing solution can provide initial development and then a second developing solution can be used to provide "solution physical development".

Useful development temperatures can range from at least 15° C. and up to and including 60° C. Useful development times can range from at least 10 seconds and up to and including 10 minutes but more likely up to and including 1 minute. The same time or temperature can be used for individual development steps and can be adapted to develop at least 90 mol % of the exposed silver halide. If a prebath solution is not used, the development time can be extended appropriately. Any exposed silver halide(s) in each hydrophilic overcoat is also developed during the development step(s). Washing or rinsing can be carried out with water after or between any development steps.

After development of the exposed silver halide to silver metal, the undeveloped silver halide (in both hydrophilic overcoat and non-color hydrophilic photosensitive layer) is generally removed by treating the developed silver-containing article with a fixing solution. Fixing solutions are well known in the black-and-white photographic art and contain one or more compounds that complex the silver halide for removal from the layers. Thiosulfate salts are commonly used in fixing solutions. The fixing solution can optionally contain a hardening agent such as alum or chrome-alum. The developed film can be processed in a fixing solution immediately after development, or there can be an intervening stop bath or water wash or both. Fixing can be carried out at any suitable temperature and time such as at least 20° C. for at least 30 seconds.

After fixing, the silver metal-containing article can be washed or rinsed in water that can optionally include surfactants or other materials to reduce water spot formation upon drying. Drying can be accomplished in ambient or by heating, for example, in a convection oven at a temperature above 50° C. but below the glass transition temperature of the transparent substrate.

Fixing then leaves the silver metal (or nuclei) in the pattern in each formerly non-color hydrophilic photosensitive layer, which pattern was originally provided by imagewise exposure and corresponding to the latent pattern. Fixing also removes any non-developed silver halide in each hydrophilic overcoat.

After fixing and before drying as described above, the article comprising the conductive silver metal pattern can be further washed or rinsed with water and then treated to further enhance the conductivity of the silver metal (or nuclei) in the pattern on each supporting side of the transparent substrate. A variety of ways have been proposed to carry out this "conductivity enhancement" process. For example, U.S. Pat. No. 7,985,527 (Tokunaga) and U.S. Pat. No. 8,012,676 (Yoshiki et al.) describe treatments using hot water baths, water vapor, reducing agents, or halides. The details of such treatments are provided in these patents that are incorporated herein by reference.

It is also possible enhance conductivity of the silver metal particles by repeated contact with a conductivity enhancing agent, washing, drying, and repeating this cycle of treating, washing, and drying one or more times. Useful conductivity enhancing agents include but are not limited to, sulfites, borane compounds, hydroquinones, p-phenylenediamines, and phosphites. The treatment can be carried out at a temperature of at least 30° C. and up to and including 90° C. for at least 0.25 minute and up to and including 30 minutes.

It can be useful in some embodiments to treat the conductive film element with a hardening bath after fixing and before drying to improve the physical durability of the resulting conductive film element. Such hardening baths can include one or more known hardening agents in appropriate amounts that would be readily apparent to one skilled in the art.

Additional treatments such as with a stabilizing bath can also be carried out before a final drying if desired, at any suitable time and temperature.

The method of this invention can be carried out using a black-and-white silver halide conductive film element precursor comprising on both first and opposing second supporting sides of the transparent substrate, suitable first and second non-color hydrophilic photosensitive layers and first and second hydrophilic overcoats disposed over the first and second non-color hydrophilic photosensitive layers, respectively, the first and second hydrophilic overcoats being the outermost layers on the respective first supporting and opposing second supporting sides of the transparent substrate.

In such methods, both first and second non-color hydrophilic photosensitive layers are appropriately exposed to provide the same or different (usually different) latent patterns containing silver halide in the first and second non-color hydrophilic photosensitive layer. These different exposures can be simultaneous or sequential in manner.

The silver halides in the latent images in the two opposing layers are then converted to silver metal nuclei on both sides during the contacting the exposed conductive film element precursor to the developing solution comprising the silver halide developing agent. Thus, both sides can be developed simultaneously.

Unconverted silver halide can be removed from the first and second non-color hydrophilic photosensitive layers, leaving silver metal in the respective first and second patterns corresponding to the first and second latent patterns on opposing supporting second sides of the transparent substrate.

Optionally and desirably, the silver metal nuclei in the patterns on both sides of the element can be further treated as described above to enhance silver metal conductivity.

The present invention provides at least the following embodiments and combinations thereof, but other combinations of features are considered to be within the present invention as a skilled artisan would appreciate from the teaching of this disclosure:

1. A black-and-white silver halide conductive film element precursor comprising a transparent substrate comprising a first supporting side and an opposing second supporting side, and having disposed on the first supporting side:

a first non-color hydrophilic photosensitive layer comprising a silver halide coverage of at least 3,500 mg Ag/m$^2$, and a first hydrophilic overcoat disposed over the first non-color hydrophilic photosensitive layer, which first hydrophilic overcoat is the outermost layer on the first supporting side of the transparent substrate, and the first hydrophilic overcoat comprises: (a) one or more immobilized radiation absorbers in a total amount of at least 5 mg/m$^2$, and optionally (b) one or more silver halides in a total amount of at least 5 mg Ag/m$^2$.

2. The conductive film element precursor of embodiment 1, wherein the one or more immobilized radiation absorbers are present in the first hydrophilic overcoat in a total amount of at least 5 mg/m$^2$ and up to and including 100 mg/m$^2$.

3. The conductive film element precursor of embodiment 1 or 2, wherein each of the one or more immobilized radiation absorbers has a c(logP) value of at least 5.

4. The conductive film element precursor of any of embodiments 1 to 3, wherein at least one of the one or more immobilized radiation absorbers is an immobilized ultraviolet radiation absorber having an absorption $\lambda_{max}$ of at least 200 nm and up to and including 450 nm.

5. The conductive film element precursor of any of embodiments 1 to 4, wherein at least one of the one or more immobilized radiation absorbers is an immobilized ultraviolet radiation absorber that is selected from one or more of the classes of compounds consisting of benzotriazoles, benzophenones, cinnamic acid compounds, triazines, stilbenes, benzoxazoles, dibenzoylmethanes, cyanoesters, cyanosulfones, cyanoacrylates, formamindines, and benzoazinones 6. The conductive film element precursor of any of embodiments 1 to 5, wherein the dry thickness of the first hydrophilic overcoat is at least 100 nm and up to and including 800 nm.

7. The conductive film element precursor of any of embodiments 1 to 6, further comprising a radiation absorbing layer between the first supporting side of the transparent substrate and the first non-color hydrophilic photosensitive layer.

8. The conductive film element precursor of any of embodiments 1 to 7, wherein the first non-color hydrophilic photosensitive layer comprises silver halide coverage of at least 3,500 mg Ag/m$^2$ and up to and including 8,000 mg Ag/m$^2$.

9. The conductive film element precursor of any of embodiments 1 to 8, further comprising on the opposing second supporting side of the transparent substrate, a second non-color hydrophilic photosensitive layer and a second hydrophilic overcoat disposed over the second non-color hydrophilic photosensitive layer, the second hydrophilic overcoat comprising: (a) one or more immobilized radiation absorbers in a total amount of at least 5 mg/m$^2$, and optionally (b) one or more silver halides in a total amount of at least 5 mg Ag/m$^2$.

10. The conductive film element precursor of embodiment 9, wherein the one or more immobilized radiation absorbers in both of the first hydrophilic overcoat and the second hydrophilic overcoat are of the same class of materials and are present in the same total amount, within ±20%.

11. The conductive film element precursor of embodiment 9 or 10, wherein at least one of the one or more immobilized radiation absorbers is an immobilized ultraviolet radiation absorber that is present in an amount of at least 5 mg/m$^2$ and up to and including 100 mg/m$^2$, and the at least one immobilized ultraviolet radiation absorber has a c(logP) value of at least 5.

12. A method for preparing a conductive film element comprising:
   providing the black-and-white silver halide conductive element film precursor of any of embodiments 1 to 11,
   imagewise exposing the black-and-white silver halide conductive film element precursor to provide a latent pattern in the first non-color hydrophilic photosensitive layer,
   converting the silver halide in the latent pattern to a silver metal pattern by contacting the latent pattern with a developing solution comprising a silver halide developing agent,
   removing unconverted silver halide from the first non-color hydrophilic photosensitive layer, leaving a silver metal pattern corresponding to the latent pattern, and
   optionally further treating the silver metal pattern to enhance its conductivity.

13. The method of embodiment 12, wherein at least one of the one or more immobilized radiation absorbers in the first hydrophilic overcoat is an immobilized ultraviolet radiation absorbers that is present in a total amount of at least 5 mg/m$^2$ and up to and including 100 mg/m$^2$, and the immobilized ultraviolet radiation absorber has a c(logP) of at least 5.

14. The method of embodiment 12 or 13, wherein each of the one or more immobilized radiation absorbers has a $\lambda_{max}$ absorption of at least 200 nm and up to and including 450 nm.

15. The method of any of embodiments 12 to 14, wherein the first non-color hydrophilic photosensitive layer comprises one or more silver halides at a total coverage of at least 3,500 mg Ag/m$^2$ and up to and including 8,000 mg Ag/m$^2$, and the first hydrophilic overcoat further comprises the same or different silver halide in a coverage of at least 5 mg Ag/m$^2$ and up to and including 150 mg Ag/m$^2$.

16. A conductive film element obtained from any of the embodiments 1 to 11 using any of the methods of embodiments 12 to 15, the conductive film element comprising:
   a transparent substrate that is optionally flexible, and the conductive film element comprising a first supporting side and an opposing second supporting side, and comprising on the first supporting side:
   a first non-color hydrophilic layer comprising a conductive silver pattern, and the conductive film element having an integrated transmittance of at least 75% in the conductive silver pattern, and
   a first hydrophilic overcoat disposed over the first non-color hydrophilic layer, which first hydrophilic overcoat is the outermost layer on the first supporting side of the transparent substrate, and the first hydrophilic overcoat comprises one or more immobilized radiation absorbers in a total amount of at least 5 mg/m$^2$.

17. The conductive film element of embodiment 16, wherein at least one of the one or more immobilized radiation absorbers is an immobilized ultraviolet radiation absorber having a c(logP) value of at least 5.

18. The conductive film element of embodiment 16 or 17, wherein the conductive silver pattern on the first supporting side of the transparent substrate and the conductive silver pattern on the opposing second supporting side of the transparent substrate are different in pattern arrangement.

The following Examples are provided to illustrate the practice of this invention and are not meant to be limiting in any manner.

Black-and-white conductive film element precursors were prepared using 100 μm poly(ethylene terephthalate) transparent substrate and coated silver halide emulsion that was hardened using BVSM [1,1'-(methylene(sulfonyl))bis-ethane] coated at 0.5 weight % of total gelatin.

A first layer (Layer 1) was provided for UV absorption. The UV absorption at 365 nm increased to 1.7 optical density units. Layer 1 included 1500 mg/m$^2$ of gelatin and 300 mg/m$^2$ of immobilized ultraviolet (UV) radiation absorbers. These immobilized ultraviolet radiation absorbers commercially available as TINUVIN® 8515 containing an 85/15 weight blend of TINUVIN® 328 UV absorbing dye [CAS 25973-55-1, c(logP) value of 7.25 using the SRC method described above] and TINUVIN® 326 UV absorbing dye [CAS 3896-11-5, c(logP) value of 5.55 using the SRC method].

A silver halide emulsion imaging layer (Layer 2), which included a non-color photosensitive silver halide emulsion (Emulsion 1) was provided over Layer 1. The silver (Ag) to gelatin weight ratio was kept constant at 2.33:1 (or at a volume ratio of about 0.297:1).

The conductive film element precursor further included a hydrophilic overcoat layer (Layer 3) over Layer 2, which Layer 3 included 488 mg/m$^2$ of gelatin, 6 mg/m$^2$ of 0.6 μm insoluble polymeric matte particles, and conventional coating surfactants. Some conductive film element precursors also included a low level of a non-color silver halide emulsion (Emulsion 2) in Layer 3, which emulsion had a composition of 98 mol % silver chloride and 2 mol % silver iodide. The emulsion grains had cubic morphology and an edge length 0.36 μm.

The resulting conductive film element precursors were exposed through a chromed design mask using UV radiation at a wavelength of 365 nm. The mask featured a grid pattern that provided exposure through lines having a three μm opening onto the conductive film element precursor, with the radiation impacting Layer 3 first.

The exposed conductive film element precursors described above were processed to reduce the silver cations in the UV exposed regions to silver metal and to form conductive film elements using the processing sequence shown below in TABLE I. The evaluation results of the conductive film elements are shown below in TABLE VII.

TABLE I

| Processing Sequence | | |
|---|---|---|
| Processing Step/Solution | Processing Temperature (° C.) | Processing Time, (minutes) |
| Developing/Developer 1 | 40 | 0.5 |
| Washing/rinsing with water | 40 | 1.0 |
| Developing/Developer 2 | 40 | 3.0 |
| Fixing/Fixing Solution | 40 | 1.77 |
| Washing/rinsing with water | 40 | 1.0 |
| Conductivity Enhancement/Conductivity Enhancement Solution | 60 | 2.0 |
| Washing/rinsing with water | 40 | 1.0 |
| Drying | 60 | 15.0 |
| Conductivity Enhancement/Conductivity Enhancement Solution | 60 | 2.0 |
| Washing/rinsing with water | 40 | 1.0 |
| Drying | 60 | 15.0 |
| Conductivity Enhancement/Conductivity Enhancement Solution | 60 | 2.0 |
| Washing/rinsing with water | 40 | 1.0 |
| Drying | 60 | 15.0 |
| Stabilizing/Stabilizer Solution | 40 | 1.0 |
| Washing/rinsing with water | 40 | 1.0 |

The aqueous processing solutions used in the noted processing sequence of TABLE I are described below in TABLES II through VI, all of which processing solutions were prepared in de-mineralized water. Drying was carried out using a convection oven.

TABLE II

Developer 1

| Component | Amount (g/liter) |
|---|---|
| Potassium Hydroxide (45.5 weight %) | 10.83 |
| Sodium Bromide | 5.00 |
| 4,4-Dimethyl-1-phenyl-3-pyrazolidinone | 0.33 |
| 1-Phenyl-5-mercaptotetrazole | 0.13 |
| 5-methylbenzotriazole | 0.17 |
| Sodium hydroxide (50 weight %) | 1.82 |
| Phosphonic acid, [nitrilotris(methylene)]tris-, pentasodium salt | 0.29 |
| N,N'-1,2-ethanediylbis(N-(carboxymethyl)glycine, | 1.77 |
| Sodium carbonate monohydrate | 8.33 |
| Potassium Sulfite (45 weight %) | 83.33 |
| Hydroquinone | 12.50 |
| 5,5'-[Dithiobis(4,1-phenyleneimino)]bis(5-oxo-pentanoic acid | 0.12 |

TABLE III

Developer 2

| Component | Amount (g/liter) |
|---|---|
| Sodium Sulfite | 92.54 |
| Hydroquinone | 4.63 |
| N,N-bis(2-(bis(carboxymethyl)-amino)ethyl)-glycine, pentasodium salt | 0.950 |
| Sodium tetraborate pentahydrate | 2.830 |
| Sodium thiocyanate | 0.42 |

TABLE IV

Fixing Solution

| Component | Amount (g/liter) |
|---|---|
| Acetic Acid | 24.43 |
| Sodium hydroxide (50 weight %) | 10.25 |
| Ammonium thiosulfate | 246.50 |
| Sodium metabisulfite | 15.88 |
| Sodium tetraborate pentahydrate | 11.18 |
| Aluminum sulfate (18.5 weight %) | 36.26 |

TABLE V

Conductivity Enhancement Solution

| Component | Amount (g/liter) |
|---|---|
| [1,2-Bis(3-aminopropylamino)-ethane] | 11.15 |
| Triethanolamine (99 weight %) | 38.6 |
| Triethanolamine hydrochloride | 14.0 |
| Dimethylaminoborane | 12.0 |
| Sodium lauryl sulfate | 0.030 |
| 2,2-Bipyridine | 1.00 |

TABLE VI

Stabilizer Solution

| Component | Amount (g/liter) |
|---|---|
| Sodium hydroxide (50 weight %) | 0.29 |
| N-[3-(2,5-dihydro-5-thioxo-1H-tetrazol-1-yl)phenyl]acetamide | 0.82 |

Comparative Example 1

A comparative conductive film element precursor was prepared using a standard photographic gelatin overcoat (no immobilized ultraviolet radiation absorber) as Layer 3 whose overall thickness was 0.45 µm.

Invention Example 1

In a conductive film element precursor prepared according to the present invention as described above, the first hydrophilic overcoat (Layer 3) formed over Layers 1 and 2 contained 10 mg/m$^2$ of TINUVIN® 328 immobilized ultraviolet radiation absorber and 20 mg/m$^2$ of Emulsion 2 described above.

Invention Example 2

Another conductive film element precursor of the present invention was prepared as described in Invention Example 1 except that the first hydrophilic overcoat (Layer 3) contained 25 mg/m$^2$ of TINUVIN® 328 immobilized ultraviolet radiation absorber and 20 mg/m$^2$ of Emulsion 2 described above.

TABLE VII

| Example | Immobilized UV Radiation Absorber in Layer 3 (mg/m$^2$) | Resultant Silver Line Width in Conductive Film (µm) |
|---|---|---|
| Comparative Example 1 | 0 | 5.1 |
| Invention Example 1 | 10 | 4.7 |
| Invention Example 2 | 25 | 4.4 |

These results indicate that the presence of an immobilized ultraviolet radiation absorber in the hydrophilic overcoat of the conductive film element precursors provided a reduction of the average width conductive grid lines in the conductive film elements that were obtained after processing. This desirable result will increase the resulting % transmittance and reduced visibility of the grid lines in the conductive articles.

Invention Example 3

In another conductive film element precursor prepared according to the present invention, the first hydrophilic overcoat (Layer 3) provided over Layers 1 and 2 according to Invention Example 1, contained 10 mg/m$^2$ of an 85/15 weight blend of TINUVIN® 328 immobilized ultraviolet radiation absorber and TINUVIN® 326 immobilized ultraviolet radiation absorber, but no silver halide.

The invention has been described in detail with particular reference to certain preferred embodiments thereof, but it will be understood that variations and modifications can be effected within the spirit and scope of the invention.

The invention claimed is:

1. A black-and-white silver halide conductive film element precursor comprising a transparent substrate comprising a first supporting side and an opposing second supporting side, and having disposed on the first supporting side:

a first non-color hydrophilic photosensitive layer comprising a silver halide coverage of at least 3,500 mg Ag/m$^2$, and a first hydrophilic overcoat disposed over the first non-color hydrophilic photosensitive layer, which first hydrophilic overcoat is the outermost layer on the first supporting side of the transparent substrate, and the first hydrophilic overcoat comprises: (a) one or more immobilized radiation absorbers in a total amount of at least 5 mg/m², and optionally (b) one or more silver halides in a total amount of at least 5 mg Ag/m².

2. The conductive film element precursor of claim 1, wherein the one or more immobilized radiation absorbers are present in the first hydrophilic overcoat in a total amount of at least 5 mg/m² and up to and including 100 mg/m².

3. The conductive film element precursor of claim 1, wherein each of the one or more immobilized radiation absorbers has a c(logP) value of at least 5.

4. The conductive film element precursor of claim 1, wherein at least one of the one or more immobilized radiation absorbers is an immobilized ultraviolet radiation absorber having an absorption $\lambda_{max}$ of at least 200 nm and up to and including 450 nm.

5. The conductive film element precursor of claim 1, wherein at least one of the one or more immobilized radiation absorbers is an immobilized ultraviolet radiation absorber that is selected from one or more of the classes of compounds consisting of benzotriazoles, benzophenones, cinnamic acid compounds, triazines, stilbenes, benzoxazoles, dibenzoylmethanes, cyanoesters, cyanosulfones, cyanoacrylates, formamindines, and benzoazinones.

6. The conductive film element precursor of claim 1, wherein the dry thickness of the first hydrophilic overcoat is at least 100 nm and up to and including 800 nm.

7. The conductive film element precursor of claim 1, further comprising a radiation absorbing layer between the first supporting side of the transparent substrate and the first non-color hydrophilic photosensitive layer.

8. The conductive film element precursor of claim 1, wherein the first non-color hydrophilic photosensitive layer comprises silver halide coverage of at least 3,500 mg Ag/m² and up to and including 8,000 mg Ag/m².

9. The conductive film element precursor of claim 1, further comprising on the opposing second supporting side of the transparent substrate, a second non-color hydrophilic photosensitive layer and a second hydrophilic overcoat disposed over the second non-color hydrophilic photosensitive layer,
the second hydrophilic overcoat comprising: (a) one or more immobilized radiation absorbers in a total amount of at least 5 mg/m², and optionally (b) one or more silver halides in a total amount of at least 5 mg Ag/m².

10. The conductive film element precursor of claim 9, wherein the one or more immobilized radiation absorbers in both of the first hydrophilic overcoat and the second hydrophilic overcoat are the same materials and are present in the same total amount, within ±20%.

11. The conductive film element precursor of claim 9, wherein at least one of the one or more immobilized radiation absorbers is an immobilized ultraviolet radiation absorber that is present in an amount of at least 5 mg/m² and up to and including 100 mg/m², and the at least one immobilized ultraviolet radiation absorber has a c(logP) value of at least 5.

12. A method for preparing a conductive film element comprising:
providing the black-and-white silver halide conductive element film precursor of claim 1,
imagewise exposing the black-and-white silver halide conductive film element precursor to provide a latent pattern in the first non-color hydrophilic photosensitive layer,
converting the silver halide in the latent pattern to a silver metal pattern by contacting the latent pattern with a developing solution comprising a silver halide developing agent,
removing unconverted silver halide from the first non-color hydrophilic photosensitive layer, leaving a silver metal pattern corresponding to the latent pattern, and
optionally further treating the silver metal pattern to enhance its conductivity.

13. The method of claim 12, wherein at least one of the one or more immobilized radiation absorbers in the first hydrophilic overcoat is an immobilized ultraviolet radiation absorbers that is present in a total amount of at least 5 mg/m² and up to and including 100 mg/m², and the immobilized ultraviolet radiation absorber has a c(logP) value of at least 5.

14. The method of claim 12, wherein each of the one or more immobilized radiation absorbers has a $\lambda_{max}$ absorption of at least 200 nm and up to and including 450 nm.

15. The method of claim 12, wherein the first non-color hydrophilic photosensitive layer comprises one or more silver halides at a total coverage of at least 3,500 mg Ag/m² and up to and including 8,000 mg Ag/m², and the first hydrophilic overcoat further comprises the same or different silver halide in a coverage of at least 5 mg Ag/m² and up to and including 150 mg Ag/m².

16. The method of claim 12, wherein the conductive film element precursor further comprises on the opposing second supporting side of the transparent substrate, a second non-color hydrophilic photosensitive layer and a second hydrophilic overcoat disposed over the second non-color hydrophilic photosensitive layer,
the second hydrophilic overcoat comprising one or more immobilized ultraviolet radiation absorbers in a total amount of at least 5 mg/m², and optionally silver halide in a coverage of at least 5 mg Ag/m².

17. A conductive film element comprising:
a transparent substrate that is flexible, and the conductive film element comprising a first supporting side and an opposing second supporting side, and comprising on the first supporting side:
a first non-color hydrophilic layer comprising a conductive silver pattern, and the conductive film element having an integrated transmittance of at least 80% in the conductive silver pattern, and
a first hydrophilic overcoat disposed over the first non-color hydrophilic layer, which first hydrophilic overcoat is the outermost layer on the first supporting side of the transparent substrate, and the first hydrophilic overcoat comprises one or more immobilized radiation absorbers in a total amount of at least 5 mg/m².

18. The conductive film element of claim 17, wherein at least one of the one or more immobilized radiation absorbers is an immobilized ultraviolet radiation absorber having a c(logP) value of at least 5.

19. The conductive film element of claim 17, further comprising on the opposing second supporting side:
a second non-color hydrophilic layer comprising a conductive silver pattern, and
a second hydrophilic overcoat disposed over the first non-color hydrophilic layer, which second hydrophilic overcoat is the outermost layer on the second supporting side of the transparent substrate, and the second hydrophilic overcoat comprising one or more immobilized radiation absorbers in a total amount of at least 5 mg/m².

20. The conductive film element of claim 19, wherein the conductive silver pattern on the first supporting side of the transparent substrate and the conductive silver pattern on the opposing second supporting side of the transparent substrate are different in pattern arrangement.

* * * * *